United States Patent
Jung et al.

(10) Patent No.: US 7,599,237 B2
(45) Date of Patent: Oct. 6, 2009

(54) MEMORY DEVICE AND METHOD FOR PRECHARGING A MEMORY DEVICE

(75) Inventors: Jong-Hoon Jung, Seongnam-si (KR); Dong-Wook Seo, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 96 days.

(21) Appl. No.: 11/843,379

(22) Filed: Aug. 22, 2007

(65) Prior Publication Data

US 2008/0062792 A1 Mar. 13, 2008

(30) Foreign Application Priority Data

Sep. 7, 2006 (KR) ................. 2006-86289

(51) Int. Cl.
*G11C 8/00* (2006.01)
(52) U.S. Cl. .............. 365/203; 365/205; 365/230.02
(58) Field of Classification Search ........... 365/203, 365/205, 230.02, 189.02
See application file for complete search history.

(56) References Cited

U.S. PATENT DOCUMENTS 6,091,620 A * 7/2000 Kablanian ............... 365/63
6,418,067 B1 * 7/2002 Watanabe et al. .......... 365/200
6,836,446 B2 12/2004 Hira et al.

FOREIGN PATENT DOCUMENTS

| JP | 2002-170388 | 6/2002 |
|---|---|---|
| KR | 1997-0076832 | 12/1997 |
| KR | 1020020002671 | 1/2002 |
| KR | 1020060063217 | 6/2006 |

\* cited by examiner

*Primary Examiner*—Tuan T Nguyen
*Assistant Examiner*—Hien N Nguyen
(74) *Attorney, Agent, or Firm*—F. Chau & Associates, LLC

(57) ABSTRACT

A memory device having a short precharge time is included. The memory device selects at least two pairs of bit lines and connects the selected two pairs of bit lines to the sense amplifier within a preparatory period during which the two pairs of bit lines and an input to the sense amplifier are precharged. In the preparatory period an input unit of the sense amplifier is precharged through by a plurality of precharge units through more than two bit lines, and thus the precharge time may be decreased. The memory device selects one pair of bit lines and connects the selected pair of bit lines to a sense amplifier within a read/write (data transmission) period.

18 Claims, 13 Drawing Sheets

MEMORY DEVICE AND METHOD FOR PRECHARGING A MEMORY DEVICE

CROSS-REFERENCE TO RELATED APPLICATIONS

This application claims priority, under 35 USC § 119, of Korean Patent Application No. 10-2006-86289, filed on Sep. 7, 2006 in the Korean Intellectual Property Office (KIPO), which is incorporated by reference herein in its entirety.

BACKGROUND OF THE INVENTION

1. Field of the Invention

The present invention relates to techniques for delivering a signal in a semiconductor device and more particularly to an apparatus for delivering a signal, a memory device and method for precharging a memory device.

2. Description of the Related Art

A sense amplifier is used to determine the contents of a memory cell during a read operation (and in delivering signals between an external and internal core of a semiconductor device). The sense amplifier detects and amplifies relatively minute voltage or current levels of a signal that is to be transmitted through a pair of signal lines. For example in a memory device, the sense amplifier detects and amplifies a data signal of a memory cell, which is transmitted through a pair of bit lines, (a bit line and an inverted bit line). The sense amplifier is used to amplify voltage coming off bit line and an inverted bit line.

To operate the sense amplifier, an input unit of the sense amplifier and the pair of signal lines typically have to be precharged to a known or nominal voltage level. Voltages of the signal line and the inverted signal line in the precharged pair of signal lines are made equal to each other through the precharge operation.

FIG. 1 is a circuit block diagram of a conventional connection circuit for precharging pairs of bit lines and a sense amplifier in a conventional SRAM 100.

A static random access memory (SRAM) that has its own amplifying function in a memory cell does not require a sense amplifier with respect to each of pairs of bit lines. However, a dynamic random access memory (DRAM) does not have its own amplifying function within each memory cell, and thus requires a sense amplifier.

Referring to FIG. 1, pairs of bit lines respectively coupled with first column memory cells 111, second column memory cells 112, and Nth column memory cells 11N are commonly connected to a single sense amplifier 150 through a multiplexer 140.

For example, the multiplexer 140 includes a first switching unit 141, a second switching unit 142, and an Nth switching unit 143. The first switching unit 141 is connected to a first pair of bit lines including bit line BL1 and inverted bit line /BL1 The second switching unit 142 is connected to a second pair of bit lines including bit line BL2 and inverted bit line /BL2. The Nth switching unit 143 is connected to an Nth pair of bit lines including bit line BLN and inverted bit line /BLN.

Each of the plurality of N switching units (141, 142 . . . 143) is activated by a logic low (active low) switching signal. When a first switching signal SW_EN1 is at the logic low voltage level, the first switching unit 141 connects the first pair of bit lines to the sense amplifier 150. When the first switching signal SW_EN1 is at a logic high voltage level, the first switching unit 141 disconnects the first pair of bit lines from the sense amplifier 150. When the second switching signal SW_EN2 is at the logic low voltage level, the second switching unit 142 connects the second pair of bit lines to the sense amplifier 150. When the second switching signal SW_EN2 is at a logic high voltage level, the second switching unit 142 disconnects the second pair of bit lines from the sense amplifier 150. When the Nth switching signal SW_ENn is at the logic low voltage level, the Nth switching unit 143 connects the Nth pair of bit lines to the sense amplifier 150. When the Nth switching signal SW_ENn is at a logic high voltage level, the Nth switching unit 143 disconnects the Nth pair of bit lines from the sense amplifier 150.

In a read/write operation period (i.e., an active period or a transmission period), the multiplexer 140 selects a pair of bit lines and connects the selected pair of bit lines to the sense amplifier 150. For example, when the first switching signal SW_EN1 is at the logic low voltage level, and the second switching signal SW_E N2 and the Nth switching signal SW_ENn are at the logic high voltage level, the multiplexer 140 connects only the first pair of bit lines BL1 and /BL1 to the sense amplifier 150.

A precharge control signal PRECH_EN is activated at the logic low voltage level within a preparatory period, and inactivated at a logic high voltage level within the transmission period.

Within the preparatory period (before a read/write operation period), the plurality of N precharge units (101, 102 . . . ON) precharge the plurality of N pairs of bit lines (BL1 and /BL1, BL2 and /BL2, . . . BLN and /BLN), respectively. Also, each precharge unit among the N precharge units (101, 102, . . . 10N), when selected, precharges an input unit of the sense amplifier 150.

FIG. 2 is a circuit diagram of a multiplexer control unit 200 that generates switching signals for the multiplexer 140 in FIG. 1.

The multiplexer control unit 200 generates the N switching signals SW_EN1, SW_EN2 and SW_ENn by just inverting a corresponding column address signal (Y-ADD1, Y-ADD2 . . . Y-ADDn) or a decoded signal of the column address signal. Therefore, the multiplexer control unit 200 may consist entirely of N inverters 210, 220 to 230.

During a readwrite operation period, the output signal of only one of the inverters among the N inverters (210, 220, to 230) is at the logic low voltage level, output signals of the other inverters are at the logic high voltage level.

Referring back to FIG. 1, when the first pair of bit lines BL1 and /BL1 is connected to the sense amplifier 150 in response to the N switching signals from the multiplexer control unit 200, the input unit of the sense amplifier 150 is precharged by the first precharge unit 101.

FIG. 3 is a timing diagram illustrating a process of precharging the input unit of the sense amplifier 150 in FIG. 1.

Referring to FIG. 3, FIG. 3 shows the changes of voltage levels of a word line control signal 310, the precharge control signal 320, a bit line signal 330, a sense amplifier control signal 340, switching signals 350 and 360, and a signal 370 of the input unit of the sense amplifier.

When the word line control signal 310 is at the logic high voltage level, data stored in a memory cell connected to the selected word line is provided to the pairs of bit lines. The voltage level of each of the bit line signals (e.g., on BL1 and /BL1) 330 depends upon the stored data in the memory cell. When the voltage level signal 330 on one of the bit lines (e.g., on BL1 and /BL1) is varied, the voltage level of the signal 370 of the input unit of the sense amplifier is also varied.

However, when the word line control signal 310 is at the logic high voltage level, the precharge control signal 320 is at the logic high voltage level, when the precharge control signal 320 is at the logic high voltage level, at N of the N precharge units (101, 102, ... 10N in FIG. 1) are disconnected from the pairs of bit lines.

When the voltage level of the signal 370 of the input unit of the sense amplifier is changed to a predetermined level, the sense amplifier control signal 340 becomes logic high and thus the sense amplifier operates. Therefore, the voltage level of the signal 370 of the input unit of the sense amplifier is rapidly changed. However, when the sense amplifier control signal 340 is at the logic high voltage level, because the switching signal SW_EN 350 of the selected pair of bit lines is at the logic high voltage level, the selected pair of bit lines is disconnected from the input unit of the sense amplifier 150. Meanwhile, the switching signal 360 of the unselected pair of bit lines maintains (the precharged) logic high voltage level. The output signal 370 of the input unit of the sense amplifier is outputted to an external device.

After the output signal 370 of the input unit of the sense amplifier is outputted to the external device, the sense amplifier control signal 340 and the switching signal 350 of the selected pair of bit lines become logic low. At this time, the precharge control signal 320 is at the logic low voltage level. Thus, the input unit of the sense amplifier 150 is precharged through the selected pair of bit lines.

In the conventional precharge method, precharging the input unit of the sense amplifier requires a relatively long time as illustrated in a dotted circle A, because the one precharge unit that is connected to the selected pair of bit lines precharges the input unit of the sense amplifier.

FIG. 4 is a circuit block diagram illustrating another example of a conventional connection circuit for precharging pairs of bit lines and a sense amplifier in a conventional SRAM 400.

First column memory cells 111, second column memory cells 112, Nth column memory cells 11N, pairs of bit lines, a multiplexer 440 including switching units 141, 142 and 14N, precharge units 101, 102, and 10N, and a sense amplifier 450 have the same structure and perform the same function as described with respect to FIG, 1, and thus repeated descriptions are omitted.

The SRAM 100 in FIG, 1 differs from the SEAM 400 in FIG. 4 by additionally including a distinct local precharge unit 460 for precharging the input unit of the sense amplifier 450, and a local precharge control unit 470 for controlling the local precharge unit 460.

When the local precharge control signal LPRECH_EN is at the logic low voltage level, the local precharge unit 460 precharges the input unit of the sense amplifier 450. The local precharge control unit 470 generates a local precharge control signal LPRECH_EN based upon the precharge control signal PRECH_EN and the sense amplifier control signal SENSE_EN. When the precharge control signal PRECH_EN is at the logic high voltage level or the sense amplifier control signal SENSE_EN is at the logic high voltage level, the local precharge control signal LPRECH_EN is at the logic high voltage level, otherwise the local precharge control signal LPRECH_EN is at the logic low voltage level.

FIG. 5 is a timing diagram illustrating a process of precharging the input unit of the sense amplifier in FIG. 4.

FIG. 5 illustrates changes of voltage levels of a word line control signal 510, a precharge control signal 520 a bit line signal 530, a sense amplifier control signal 540, switching signals 550 and 560, a signal 570 of the input unit of the sense amplifier, and a local precharge control signal 580.

When the word line control signal 510 is at the logic high voltage level, data stored in a memory cell connected to the selected word line is provided to the pairs of bit lines. The voltage level of the bit line signal 530 is varied according to the stored data in the memory cell. When the voltage level of the bit line signal 530 is varied, the voltage level of the signal 570 of the input unit of the sense amplifier is also varied. However, when the word line control signal 510 is at the logic high voltage level, the precharge control signal 520 is at the logic high voltage level. When the precharge control signal 520 is at the logic high voltage level, all N of the N precharge units 101, 102 and 10N are disconnected from the pairs of bit lines.

When the voltage level of the signal 570 of the input unit of the sense amplifier is changed to a predetermined level the sense amplifier control signal 540 becomes logic high, and thus the sense amplifier operates. Therefore, the voltage level of the signal 570 of the input unit of the sense amplifier is rapidly varied. However: when the sense amplifier control signal 540 is at the logic high voltage level, because the switching signal 550 of the selected pair of bit lines is at the logic high voltage level, the selected pair of bit lines is disconnected from the input unit of the sense amplifier. The switching signal 560 of the unselected pair of bit lines maintains the (precharged) logic high voltage level. The signal 570 of the input unit of the sense amplifier is outputted to an external device.

After the signal 570 of the input unit of the sense amplifier is outputted to the external device, the sense amplifier control signal 540 and the switching signal 550 of the selected pair of bit lines become logic low. At this time, the precharge control signal 520 is at the logic low voltage level. Thus, the input unit of the sense amplifier is precharged through the selected pair of bit lines.

When the sense amplifier control signal 540 is at the logic low voltage level, the local precharge control signal 580 is also at the logic low voltage level and thus the local precharge unit precharges the input unit of the sense amplifier.

Because the input unit of the sense amplifier is precharged by using the local precharge unit as well as the precharge unit that is connected to the selected pair of bit lines, precharging the input unit of the sense amplifier requires a relatively short time as illustrated in a dotted circle B.

Because the SRAM 400 in FIG. 4 further includes the local precharge unit 460 and the local precharge control unit 470, size of the chip is increased. Thus, the precharging circuit in FIG. 1 can be applied to a large scale integration (LSI) SRAM, and the precharging circuit in FIG. 4 can be applied to a small scale integration (SSI) SRAM.

Memory devices included in modern multimedia, communications and computing applications need to have high capacity and a high operation speed. Thus, a precharging circuit that performs a fast precharging operation for a high speed memory and that can be integrated in a small area is desirable.

SUMMARY OF THE INVENTION

Some exemplary embodiments of the present invention provide a memory device that operates at a high speed and can be integrated in a small area of a semiconductor chip.

Some exemplary embodiments of the present invention provide an apparatus for delivering signals supporting high speed operation of semiconductor devices such as memory devices.

Some exemplary embodiments of the present invention provide a method for rapidly precharging a memory device.

In some exemplary embodiments of the present invention, an apparatus for delivering signals includes N pairs of signal lines, N precharge units, a sense amplifier, and a multiplexer.

N represents a natural number greater than one. The N precharge units precharge the N pairs of signal lines. The sense amplifier senses and amplifies voltage levels of the bit lines one pair at a time, The multiplexer selects one pair of signal lines among the N pairs of signal lines to connect the selected pair of signal lines to the sense amplifier within a read/write (data transmission) period, and selects at least two pairs of signal lines among the N pairs of signal lines to connect the selected two pairs of signal lines to the sense amplifier within a preparatory (precharging) period.

The multiplexer may select all N of the N pairs of signal lines to connect all N of the N pairs of signal lines to the sense amplifier at the same time, within the preparatory period.

In some exemplary embodiments of the present invention, a memory device includes N pairs of bit lines, N precharge units, a sense amplifier, and a multiplexer. The N pairs of bit lines are connected to memory cells. The N precharge units precharge the N pairs of bit lines. The sense amplifier senses and amplifies voltage levels of the bit lines one pair at a time. The multiplexer selects one pair of bit lines among the N pairs of bit lines and connects the selected one pair of bit lines to the sense amplifier within a read/write (data transmission) period, and selects at least two pairs of bit lines among the N pairs of bit lines and connects the selected at least two pairs of bit lines to the sense amplifier at the same time, within a preparatory period.

The multiplexer may select all N of the N pairs of bit lines to connect all N of the M pairs of bit lines to the sense amplifier at the same time within the preparatory period.

The multiplexer may select four pairs of bit lines among the N pairs of bit lines to connect the selected four pairs of bit lines to the sense amplifier at the same time within the preparatory period.

The multiplexer may include N switching units each being connected to one of the N pairs of bit lines.

The memory device may further include a multiplexer control unit. The multiplexer control unit may generate switching signals based on a column address signal and a multiplexer control signal. The switching signals are provided to the switching units and the multiplexer control signal may be activated within the preparatory period. The multiplexer control unit logically combines the column address signal and a multiplexer control signal to generate the switching signals.

The multiplexer control unit may include a NOR-gate that performs a logical NOR operation upon the column address signal and upon the multiplexer control signal to generate the switching signals.

The memory device may further include a multiplexer control signal generating unit that generates the multiplexer control signal based on an internal clock. The multiplexer control signal generating unit may generate the multiplexer control signal by inverting the internal clock.

The memory device may be a static random access memory (SRAM) or dynamic random access memory (DRAM).

Some exemplary embodiments of the present invention provide a method for precharging a memory device. The memory device includes N pairs of bit lines connected to memory cells, N precharge units configured to respectively precharge the N pairs of bit lines, a sense amplifier, and a multiplexer configured to selectively connect and disconnect the sense amplifier to or from the N pairs of bit lines. The multiplexer is configured to selectively connect and disconnect the sense amplifier to or from select a pair of bit lines among the B pairs of bit lines and to connect the selected pair of bit lines to the sense amplifier within a transmission period. The multiplexer is further adapted to select at least two pairs of bit lines among the N pairs of bit lines and to connect the selected at least two pairs of bit lines to the sense amplifier within a preparatory periods during which period the at least two pairs of bit lines are precharged, thus precharging an input of the sense amplifier. The multiplexer may be further adapted such that all of the N pairs of bit lines may be selected within the preparatory period and connected to the sense amplifier at the same time, thus precharging an input of the sense amplifier.

For example, four pairs of bit lines among the N pairs of bit lines may be selected to connect the selected four pars of bit lines to the sense amplifier at the same time within the preparatory period, thus precharging an input of the sense amplifier.

The method for precharging a memory device may further include generating a multiplexer control signal based upon an internal clock, generating switching signals (based on the column address signal and the multiplexer control signal) for selecting at least two pairs of bit lines, and precharging all of the N pairs of bit lines within the preparatory period, and next generating a switching signal (based on a column address signal and the multiplexer control signal) for selecting one pair of precharged bit lines within the data transmission period.

Therefore, a memory device according to exemplary embodiments of the present invention may perform a rapid precharge operation and may be implemented in a small area on a semiconductor chip.

Embodiments of the present invention now will be described more fully with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items or operations.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between" "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise.

BRIEF DESCRIPTION OF THE DRAWINGS

Hereinafter, the invention will be described more fully with reference to the accompanying drawings, in which preferred embodiments of the invention are shown. The above and other features of the invention will become more apparent to persons skilled in the art by describing in detail preferred embodiments thereof with reference to the attached drawings in which like reference numerals refer to like elements, and.

DETAILED DESCRIPTION OF THE EXEMPLARY EMBODIMENTS OF THE INVENTION

Figure 1:
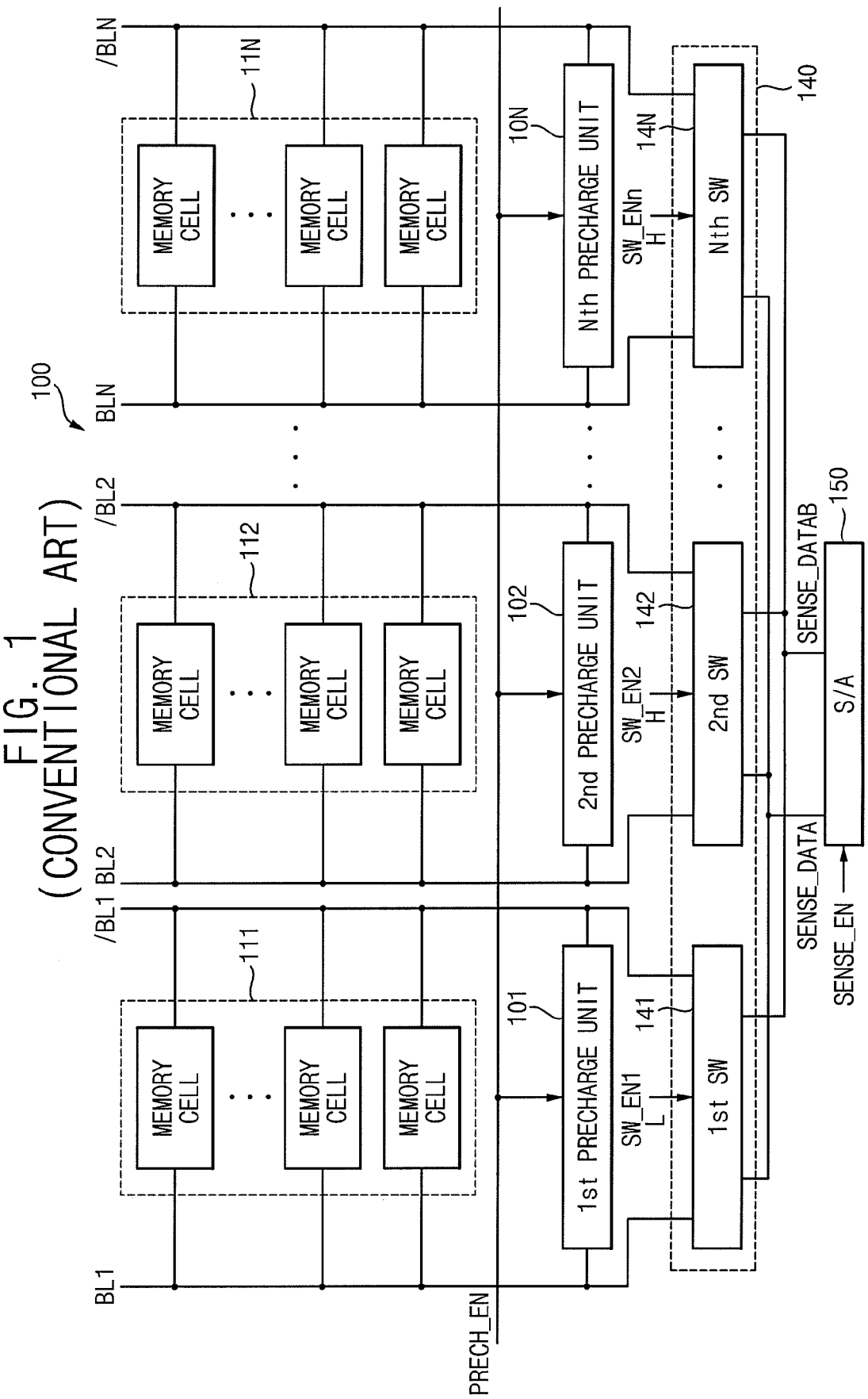
FIG. 1 is a circuit block diagram of a conventional connection circuit for precharging N pairs of bit lines and a sense amplifier in a conventional SRAM.
Figure 2:
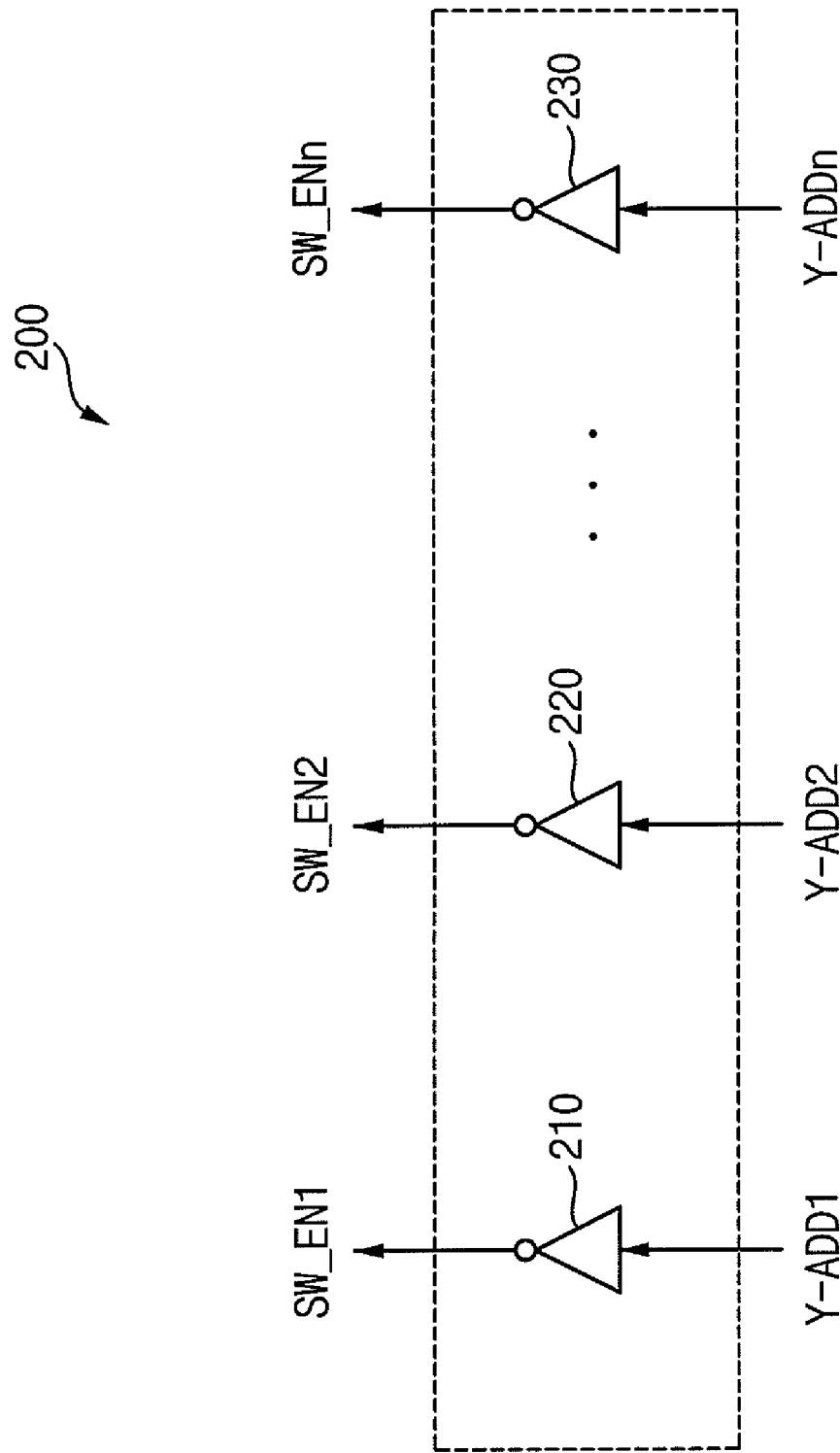
FIG. 2 is a circuit diagram of a multiplexer control unit 200 that generates switching signals for the multiplexer 140 in FIG. 1.
Figure 3:
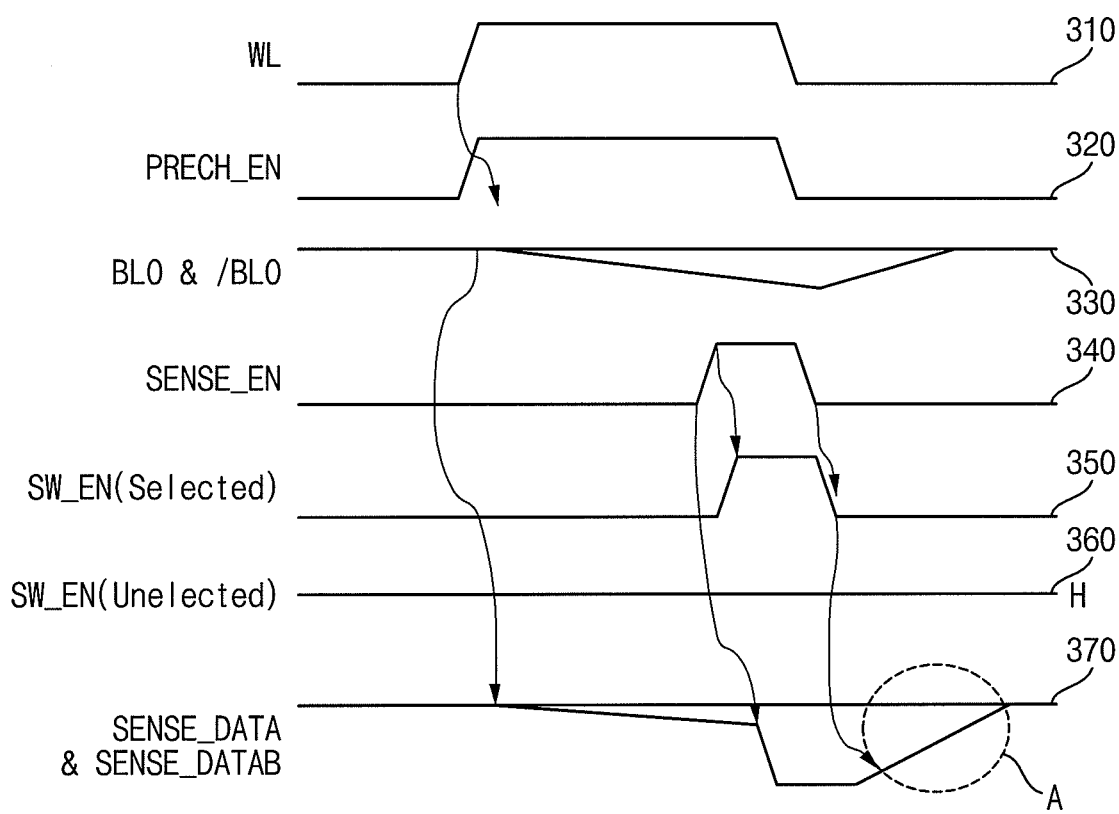
FIG. 3 is a timing diagram illustrating a process of precharging the input unit of the sense amplifier in FIG. 1.
Figure 4:
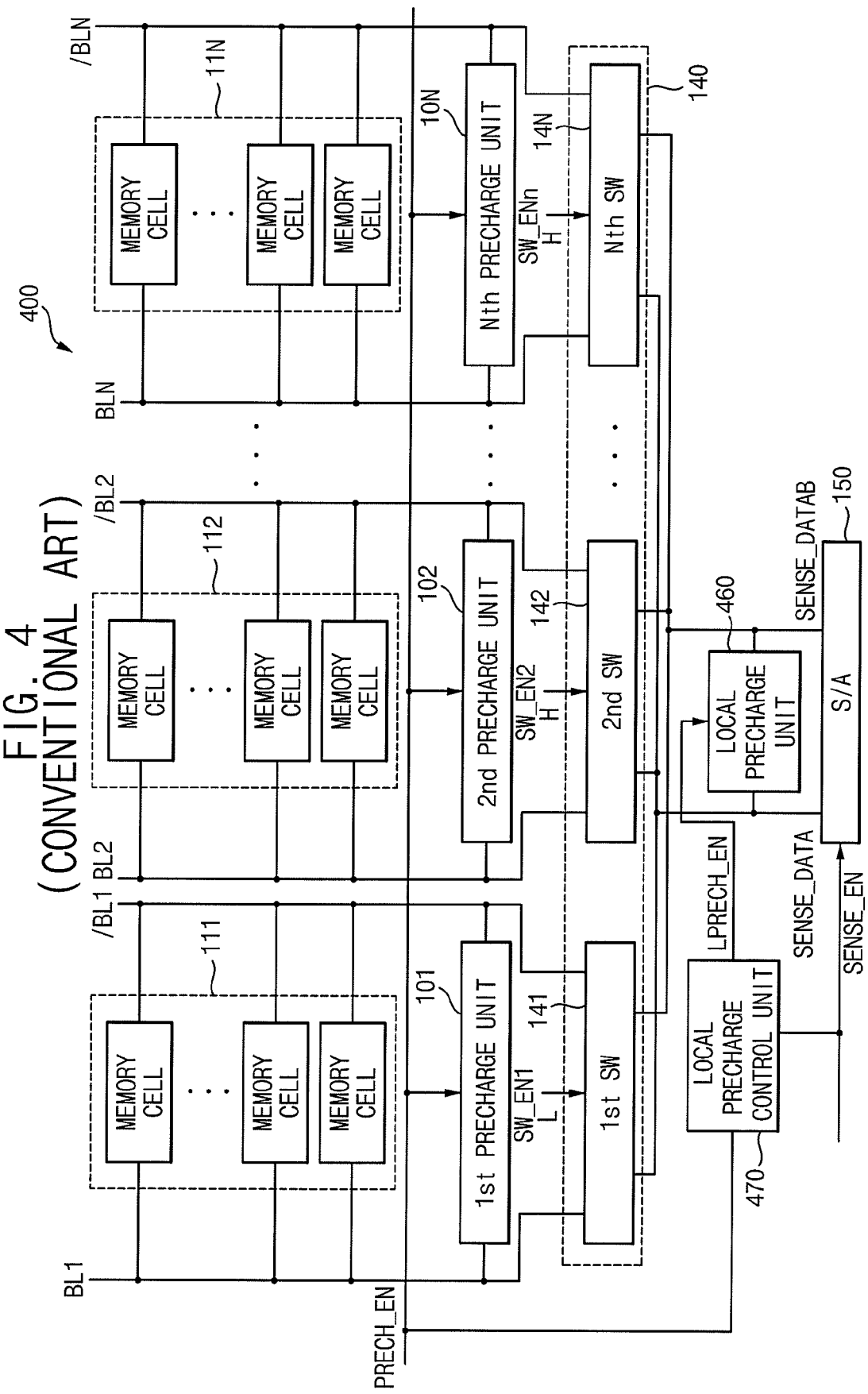
FIG. 4 is a circuit block diagram illustrating another example of a connection circuit for precharging pairs of bit lines and a sense amplifier in a conventional SRAM.
Figure 5:
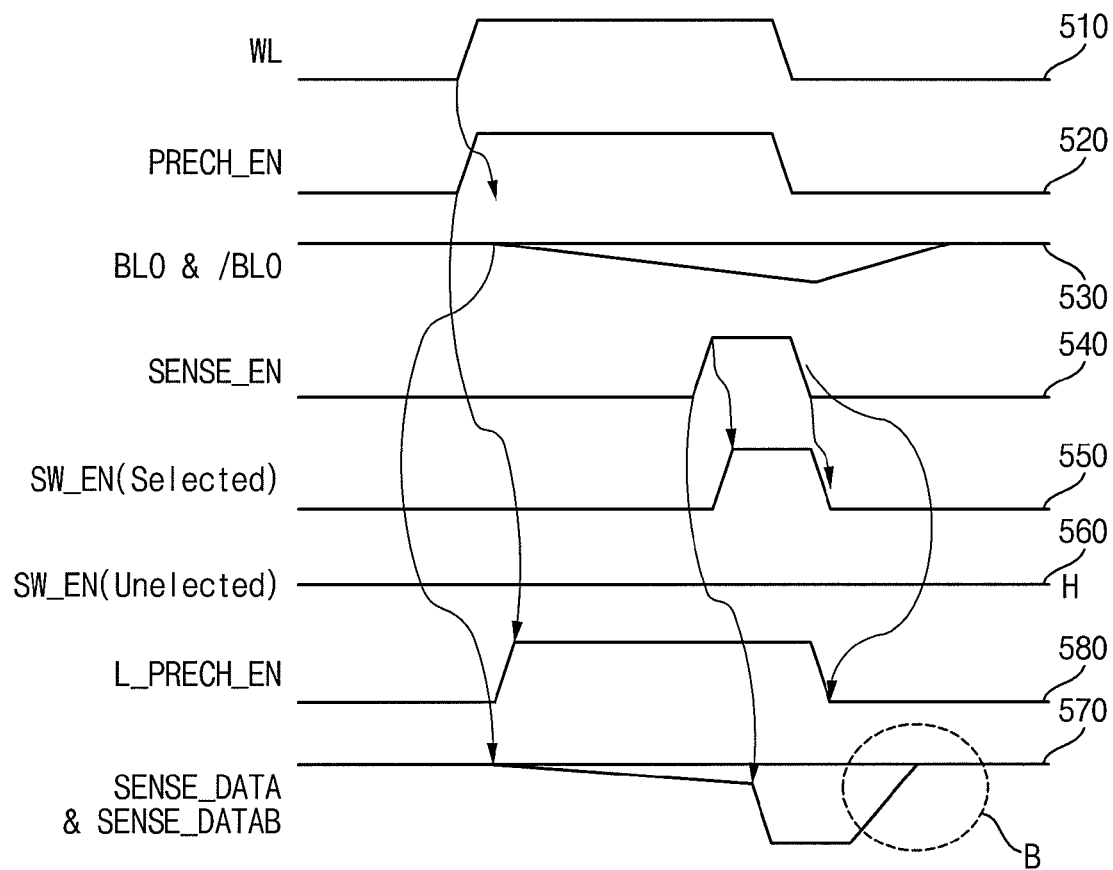
FIG. 5 is a timing diagram illustrating a process of precharging the input unit of the sense amplifier in FIG. 4.
Figure 6:
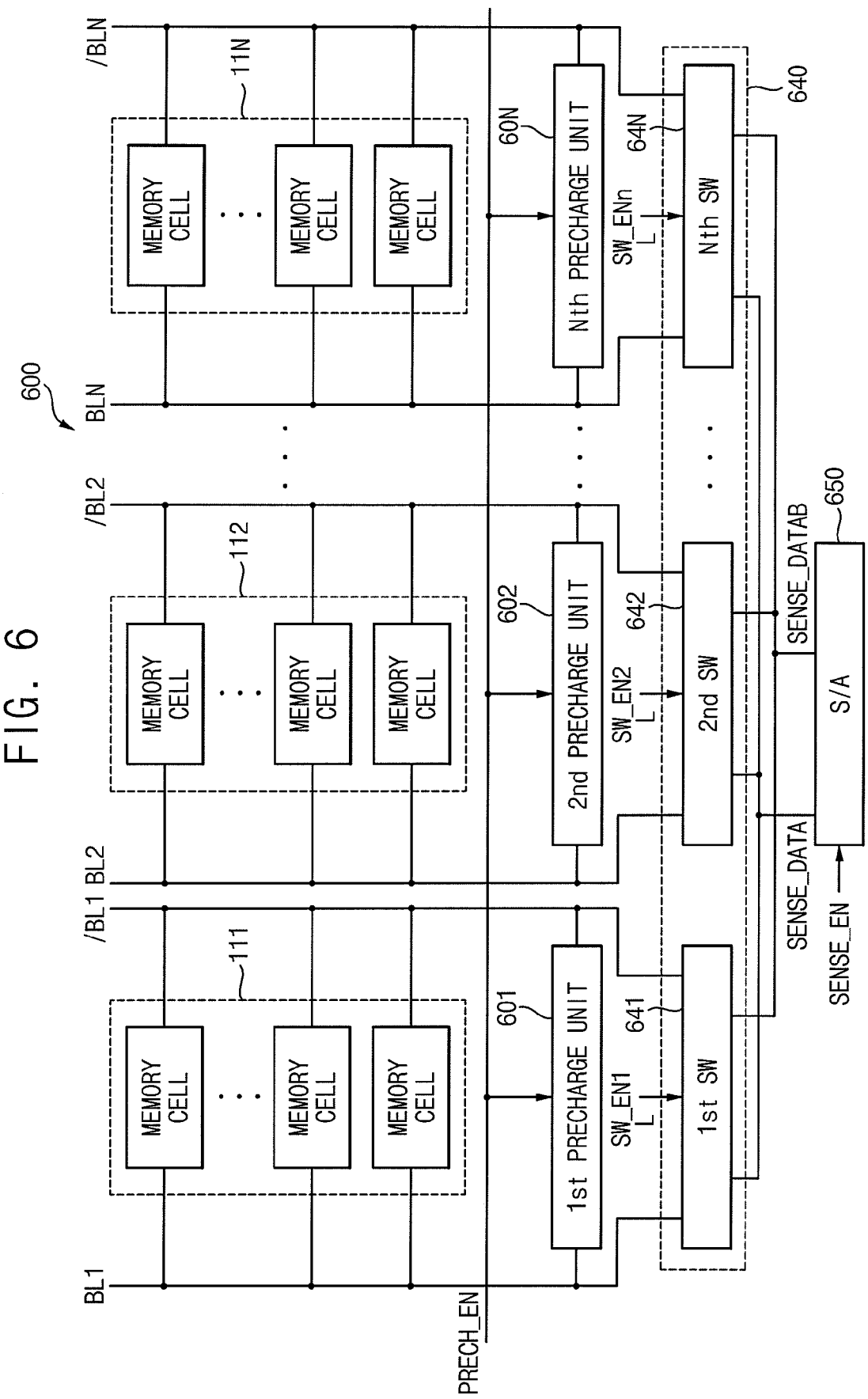
FIG. 6 is a circuit block diagram of a connection circuit for precharging pairs of bit lines and a sense amplifier in an SRAM according to an exemplary embodiment of the present invention.

FIG. 6 is a circuit block diagram of a connection circuit for precharging pairs of bit lines and a sense amplifier in an SRAM according to an exemplary embodiment of the present invention.

SRAM memory cells 111, and 112, through 11N store data, have the characteristic that the stored data are maintained as long as power is supplied.

The first column memory cells 111 are connected to a first pair of bit lines including a bit line BL1 and an inverted bit line /BL1, and output stored data or store input data through the first pair of bit lines. The second column memory cells 112 are connected to a second pair of bit lines BL2 and /BL2, and output stored data or store input data through the second pair of bit lines. The Nth column memory cells 11N are connected to an Nth pair of bit lines BLN and /BLN, and output stored data or store input data through the Nth pair of bit lines.

A multiplexer 640 includes a first switching unit 641 connected to the first pair of bit lines (BL1 and /BL1), a second switching unit 642 connected to the second pair of bit lines (BL2 and /BL2), and an Nth switching unit 643 connected to the Nth pair of bit lines (BLN and /BLN).

When a first switching signal SW_EN1 is at the logic low voltage level, the first switching unit 641 connects the first pair of bit lines (BL1 and /BL1) to the sense amplifier 650. When the first switching signal SW_EN1 is at a logic high voltage level, the first switching unit 641 disconnects the first pair of bit lines (BL1 and /BL1) from the sense amplifier 650. When a second switching signal SW_EN2 is at the logic low voltage level, the second switching unit 642 connects the second pair of bit lines (BL2 and /BL2) to the sense amplifier 650. When the second switching signal SW_EN2 is at a logic high voltage level the second switching unit 642 disconnects the second pair of bit lines (BL2 and /BL2) from the sense amplifier 650 When an Nth switching signal SW_ENn is at the logic tow voltage level, the Nth switching unit 643 connects the Nth pair of bit lines (BLN and /BLN) to the sense amplifier 650. When the Nth switching signal SW_ENn is at a logic high voltage level, the Nth switching unit 643 disconnects the Nth pair of bit lines (BLN and /BLN) from the sense amplifier 650. Alternatively, when the switching signal is at the logic high voltage level, switching units may connect a selected pair of bit lines to the sense amplifier 650.

During a read/write (data transmission) period, the multiplexer 640 selects a pair of bit lines and connects the selected pair of bit lines to the sense amplifier 650. For example, when the first switching signal SW_EN1 is at the logic low voltage level, and the second switching signal SW_EN2 and the Nth switching signal SW_ENn are at the logic high voltage level, the multiplexer 640 connects only the first pair of bit lines (BL1 and /BL1) to the sense amplifier 650.

A precharge control signal PRECH_EN is activated to the logic low voltage level within a preparatory period, and is inactivated to the logic high voltage level within the transmission period.

Within the preparatory period, a first precharge unit 610; a second precharge unit 620, and an Nth precharge unit 630 precharge the first pair of bit lines, the second pair of bit lines, and the Nth pair of bit lines, respectively. At least two precharge units among the N precharge units 610; 620; and 630 precharge the input unit of the sense amplifier 650.

Figure 7:
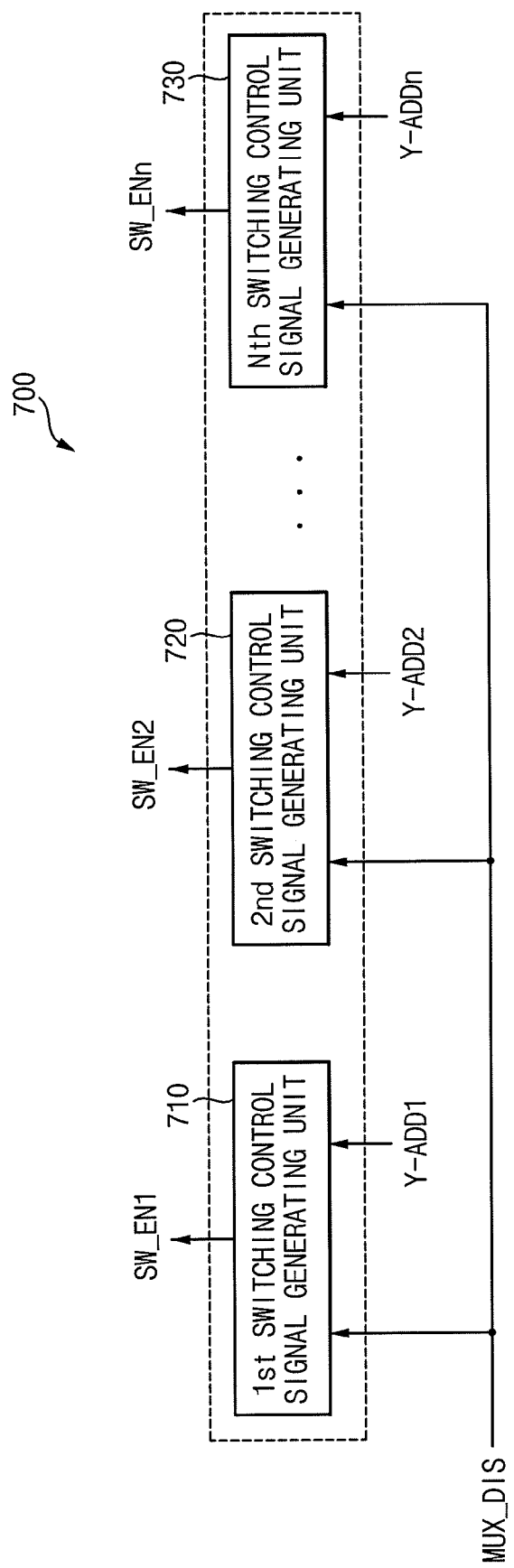
FIG. 7 is a circuit block diagram of a multiplexer control unit to generate switching signals for the multiplexer 640 in FIG. 6.

FIG. 7 is a circuit block diagram of a multiplexer control unit adapted to generate switching signals for the multiplexer 640 in FIG. 6.

A multiplexer control unit 700 generates switching signals based on a column address signal and the multiplexer control signal MUX_DIS. The multiplexer control unit 700 includes N switching control signal generating units 710, 720 and 730 and generates N switching signals corresponding to the N switching units 641, 642, and 643 in the multiplexer 640 in FIG. 6. Within the preparatory period, the N output signals SW_EN1, SW_EN2, SW_ENn of the N switching control signal generating units 710, 720 and 730 are all at the logic low voltage level. Thus, within the preparatory period, all N precharge units 610, 620, and 630 precharge the input unit of the sense amplifier 650 in FIG. 6. Within the read/write (data transmission) period, only one output signal among the N output signals SW_EN1, SW_EN2, SW_ENn of the N switching control signal generating units 710, 720 and 730 is at the logic low voltage level, and the other (N minus 1) output signals are at the logic high voltage level.

Figure 8:
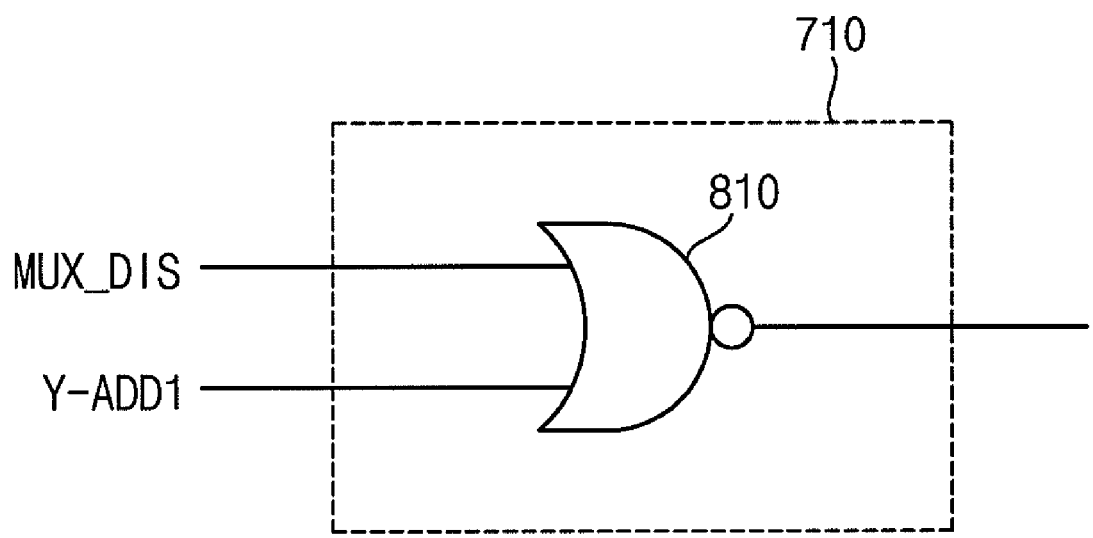
FIG. 8 is a circuit block diagram of one of the switching control signal generating units in the multiplexer control unit 700 in FIG. 7.

FIG. 8 is a circuit block diagram of one 710 of the N switching control signal generating units in the multiplexer control unit 700 in FIG. 7.

Referring to FIG. 8, the switching control signal generating unit 710 may be implemented entirely with a NOR-gate 810 that performs a logical NOR operation upon a column address signal Y-ADD1 (or a decoded column address signal) and upon a multiplexer control signal MUX_DIS.

In some exemplary embodiments, all N of the switching control signal generating units in the multiplexer control unit 700 in FIG. 7 may be implemented with NOR-gates each configured to perform a logical NOR operation upon a corresponding column address signal Y-ADD1 (or a decoded column address signal) and upon a multiplexer control signal MUX_DIS.

Within other exemplary embodiments, a predetermined number, e.g., four, switching control signal generating units in the multiplexer control unit 700 in FIG. 7 may be implemented with a NOR-gate, and the other (e.g., N minus 4) switching control signal generating units may be implemented with simple inverters (NOT-gates) that invert the column address signals. Thus, within the preparatory period, the predetermined number (e.g., 4) of precharge units precharge the input unit of the sense amplifier 650 in FIG. 6. When too many precharge units are simultaneously operated to precharge the input unit of the sense amplifier, a precharge time can be decreased, but the dynamic power consumption may be increased. Thus, when the dynamic power is considered, the input unit of the sense amplifier is precharged by using an appropriate number of precharge units that avoids excessive dynamic power consumption.

Figure 9:
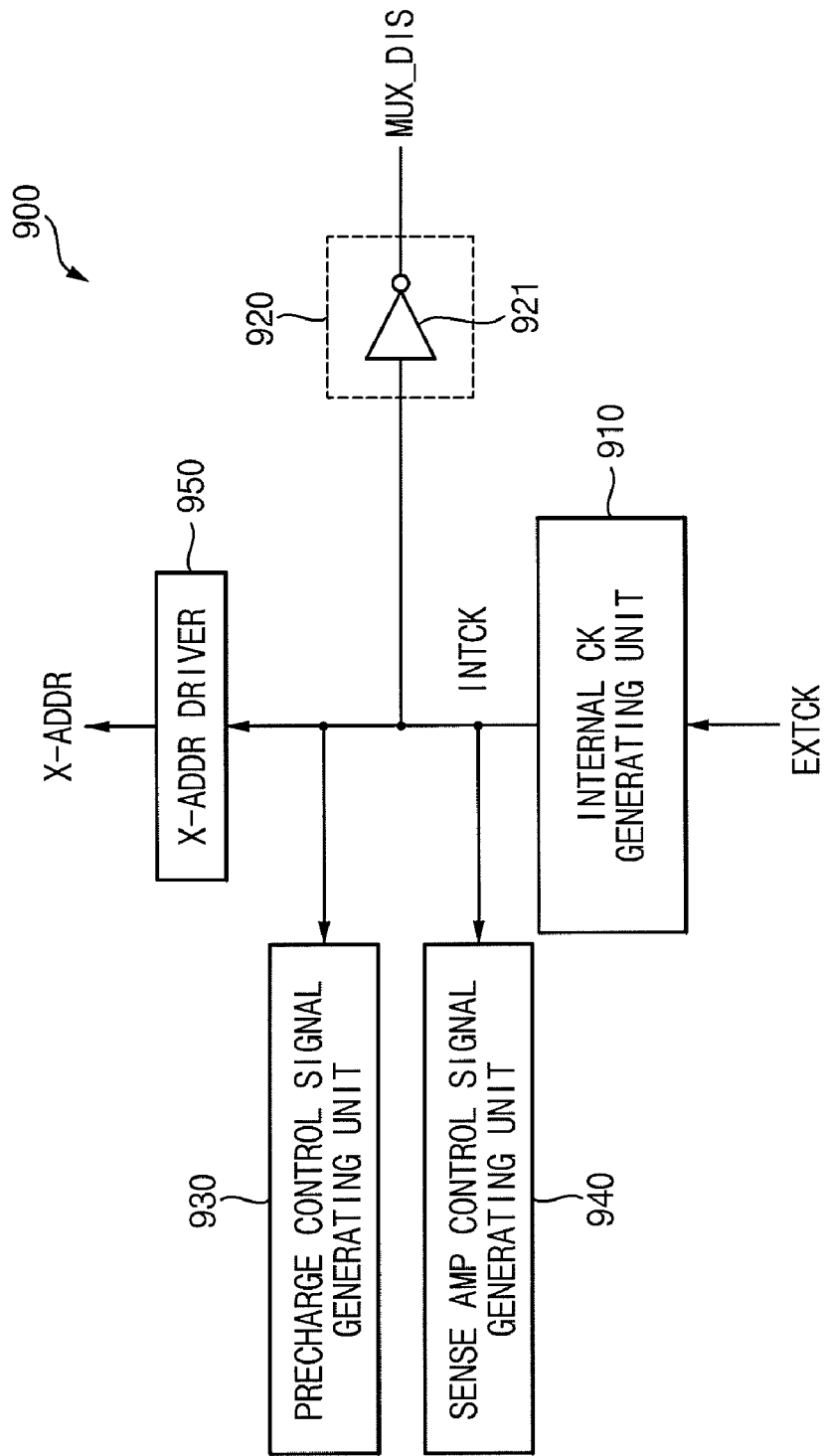
FIG. 9 is a block diagram of a control signal generating unit 900 according to an exemplary embodiment of the present invention.

FIG. 9 is a block diagram of a control signal generating unit 900 according to an exemplary embodiment of the present invention.

The control signal generating unit 900 includes an internal clock generating unit 910, a sense amplifier control signal generating unit 940, a precharge control signal generating unit 930, and a multiplexer control signal generating unit 920. The internal clock generating unit 910 is provided with an external clock EXTCK and generates an internal clock INTCK. The sense amplifier control signal generating unit 940 generates a sense amplifier control signal by using the internal clock INTCK. The precharge control signal generating unit 930 generates a precharge control signal by using the internal clock INTCK. The multiplexer control signal generating unit 920 generates a multiplexer control signal MUX_DIS.

Also, the control signal generating unit 900 receives a row address signal and outputs a row address signal that is synchronized with the internal clock INTCK to a row address driver 950.

Figure 10:
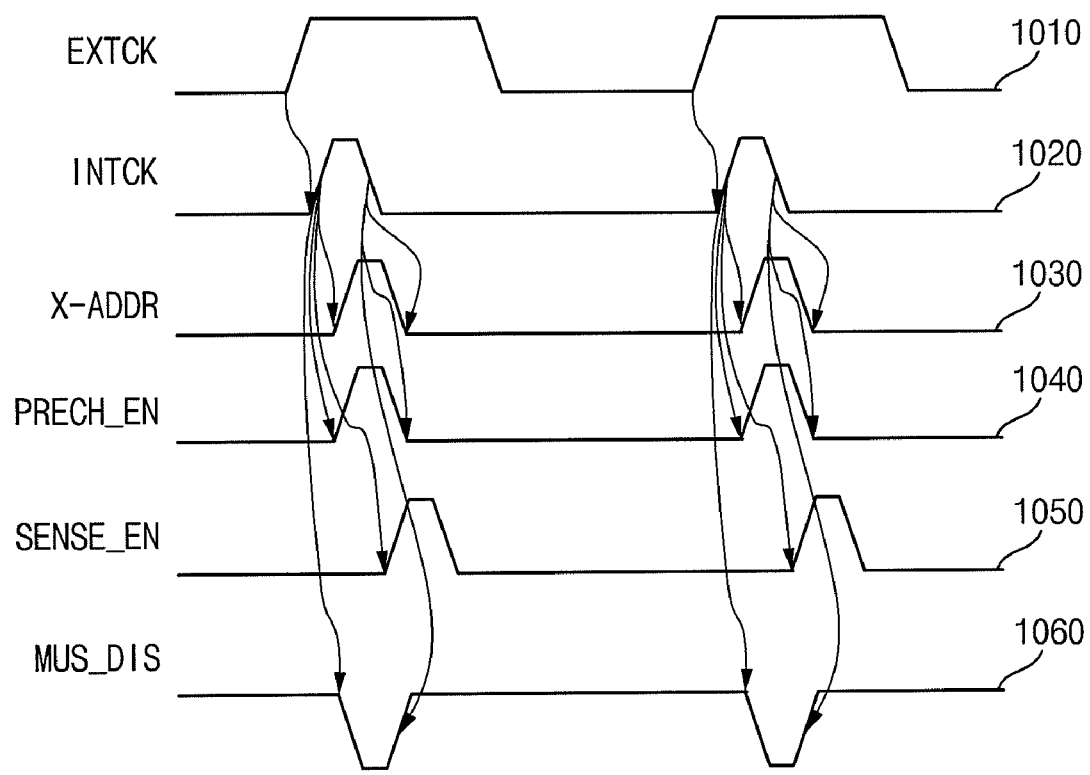
FIG. 10 is a timing diagram illustrating a process of generating control signals according to an exemplary embodiment of the present invention.

FIG. 10 is a timing diagram illustrating a process of generating control signals according to an exemplary embodiment of the present invention.

Referring to FIG. 10, an internal clock 1020 transitions to the logic high voltage level in synchronization with each rising edge of an external clock 1010. After predetermined time, the internal clock 1020 transitions to the logic low voltage level. The internal clock 1020 is used as a standard clock for generating internal control signals of a memory device.

A row address signal 1030 is outputted in synchronization with the internal clock 1020. After a predecoding and decoding process, the row address signal 1030 is used to activate a selected word line.

A precharge control signal 1040 transitions to the logic high voltage level in synchronization with each rising edge of the internal clock 1020 and transitions to the logic low voltage level in synchronization with each falling edge of the internal clock 1020.

A predetermined time after the internal clock 1020 rises, a sense amplifier control signal 1050 transitions to the logic high voltage level. When the sense amplifier control signal 1050 goes to the logic high voltage level, the internal clock 1020 transitions to the logic low voltage level. Also, after a predetermined time, the sense amplifier control signal 1050 becomes logic low.

After a multiplexer control signal 1060 transitions to the logic low voltage level in synchronization with the internal clock 1020, after predetermined time, multiplexer control signal 1060 becomes logic high again.

Figure 11:
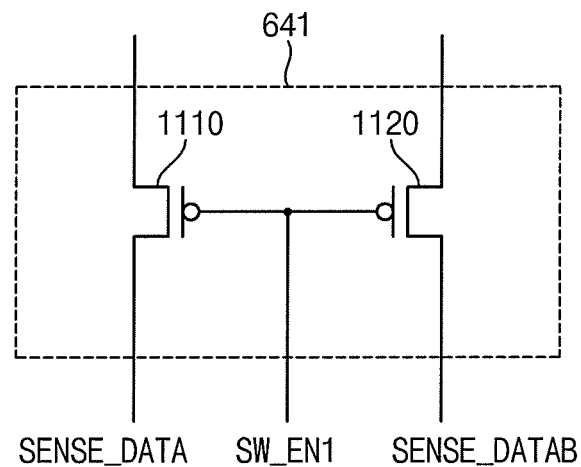
FIG. 11 is a detailed circuit diagram of the switching unit 641 in the multiplexer 640 shown in FIG. 6.

FIG. 11 is a detailed circuit diagram of the switching unit 641 in the multiplexer 640 in FIG. 6. The other switching units that are included in the multiplexer 640 in FIG. 6 have the same structure as the switching unit 641 illustrated in FIG. 11.

When a first switching signal SW_EN1 is at the logic low voltage level, a first switching unit 641 connects the first pair of bit lines (BL1 and /BL1) to the input unit of the sense amplifier. The first switching unit 641 is implemented with two p-channel metal oxide semiconductor (PMOS) transistors 1110 and 1120. The PMOS transistor 1110 connects/disconnects the bit line BL1 in FIG. 6 to/from a first input unit, which provides a sensed data SENSE_DATA to the sense amplifier The PMOS transistor 1120 connects/disconnects the inverted bit line /BL1 in FIG. 6 to/from a second input unit, which provides an inverted sensed data SENSE_DATAB to the sense amplifier.

Figure 12:
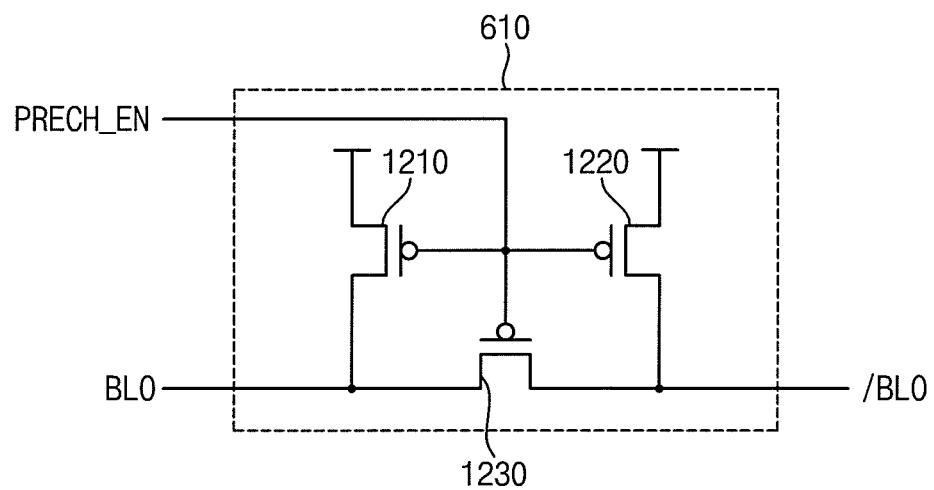
FIG. 12 is a detailed circuit diagram of one precharge unit 610 shown in FIG. 6.

FIG. 12 is a detailed circuit diagram illustrating one precharge unit 610 in FIG. 6. The other (N minus 1) precharge units (620 . . . 630) in FIG. 6 have the same structure as the first precharge unit 610 shown in FIG. 11.

Referring to FIG. 12 when a precharge control signal PRECH_EN is at the logic low voltage level, the first precharge unit 610 equalizes the voltages on the first pair of bit lines. Thus, when the first precharge transistor 1210 is turned ON, the voltage level of the bit line BL1 is increased to a power supply voltage level. When a second precharge transistor 1220 is turned ON, the voltage level of an inverted bit line /BL1 is also increased to the power supply voltage level. When an equalizing transistor 1230 is turned ON, the bit line BL1 and the inverted bit line /BL1 are electrically connected to each other and have the same voltage level.

Figure 13:
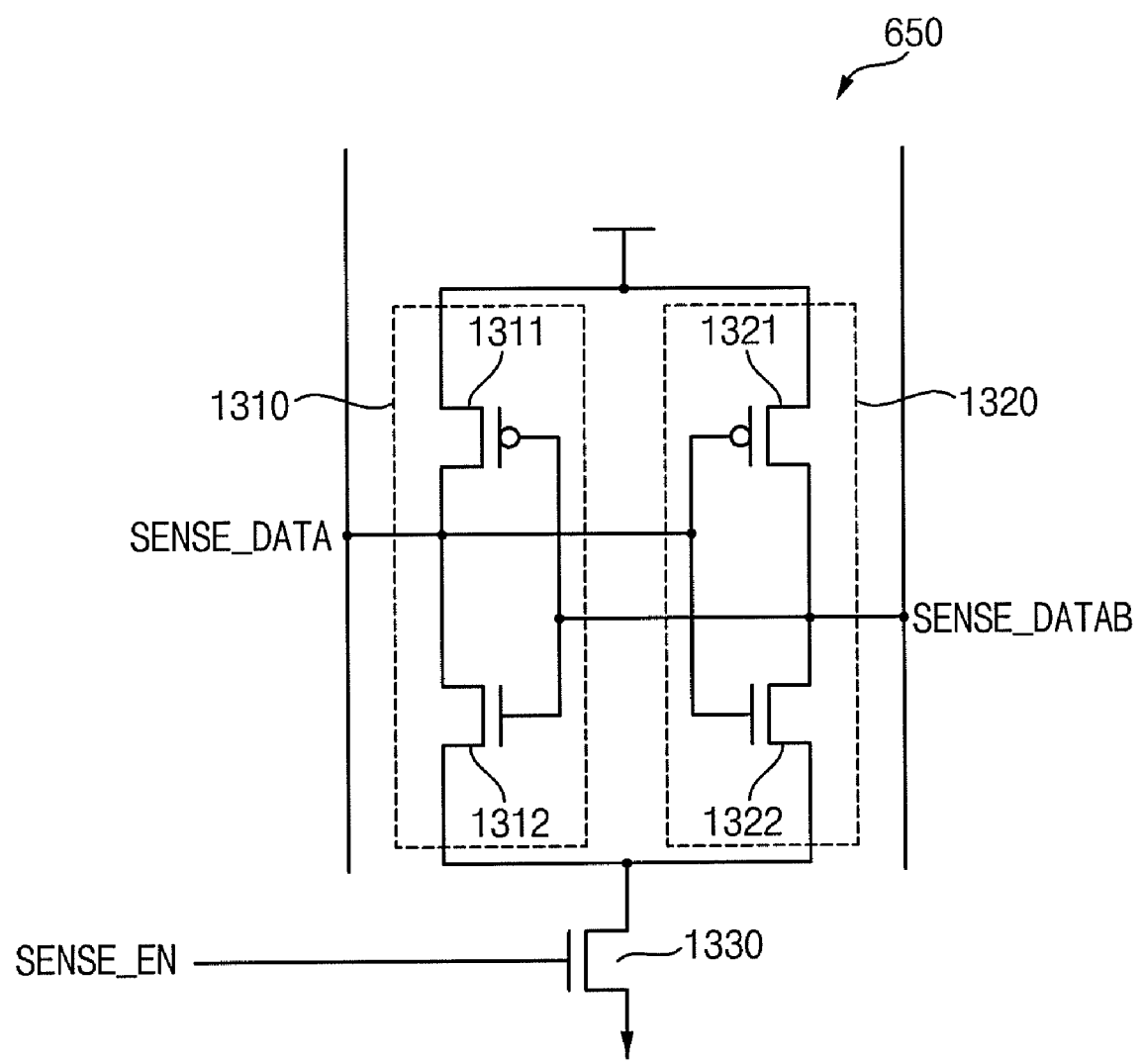
FIG. 13 is a detailed circuit diagram of the sense amplifier 650 in FIG. 6.

FIG. 13 is a detailed circuit diagram of the sense amplifier 650 in FIG. 6.

The sense amplifier 650 includes a cross-coupled inverters 1310 and 1320 that form a latch. The sense amplifier 650 includes a first inverter 1310 comprising two transistors PMOS 1311 and NMOS 1312, a second inverter 1320 comprising two transistors PMOS 1321 and NMOS 1322, and an NMOS control transistor 1330. When a sense amplifier control signal SENSE_EN is at the logic high voltage level the NMOS control transistor 1330 is turned ON.

When the NMOS control transistor 1330 is turned ON, the sense amplifier 650 senses and amplifies the voltage level of the input unit. For example, when a voltage level of a first input SENSE_DATA is higher than the voltage level of a second input SENSE_DATAB in an early period, the voltage level of the first input SENSE_DATA is gradually increased to the power supply voltage level and the voltage level of the second input SENSE_DATAB is gradually decreased to a ground voltage level by the first inverter 1310 and the second inverter 1320. On the other hand, when the voltage level of the second input SENSE_DATAB is higher than the voltage level of the first input SENSE_DATA in the early period, the voltage level of the second input SENSE_DATAB is gradually increased to the power supply voltage level and the voltage level of the first input SENSE_DATA is gradually decreased to the ground voltage level by the cross-coupled first inverter 1310 and second inverter 1320.

Figure 14:
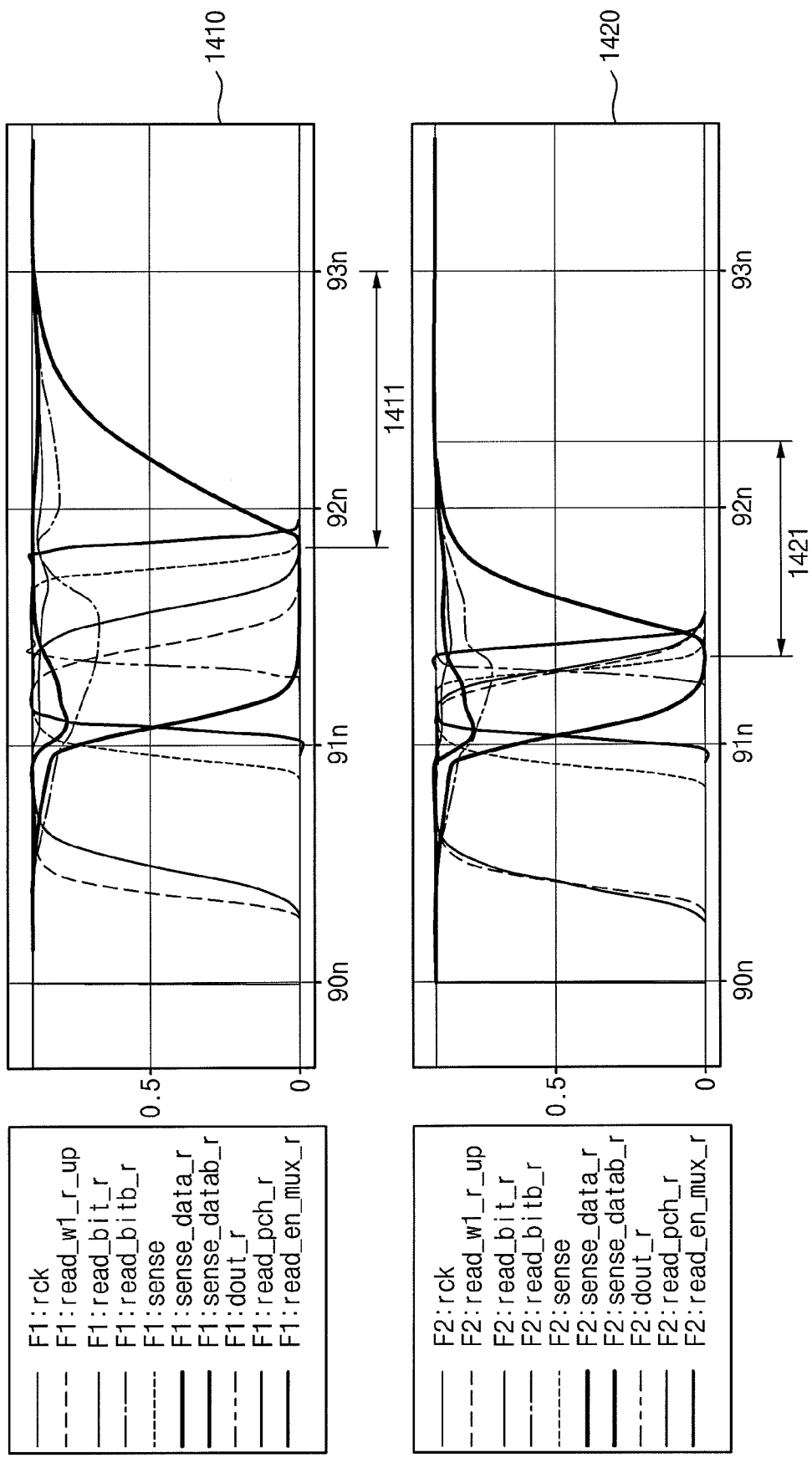
FIG. 14 is a waveform diagram illustrating the result of a simulation showing a precharge time according to a number of precharge units.

FIG. 14 is a waveform diagram illustrating the result of a simulation precharge time according to a number of precharge units.

Referring to FIG. 14, the most thick solid line refers to the result of a simulation at the voltage level of the input unit in the sense amplifier.

The precharge time 1411 of the input unit of the sense amplifier of a process 1410, in which the input unit of the sense amplifier is precharged through one precharge unit, is longer than the precharge time 1421 of the input unit of the sense amplifier of a process 1420, in which the input unit of the sense amplifier is precharged through two precharge units.

Likewise, as the number of precharge units that participate in precharging the input unit of the sense amplifier increases, the precharge time is decreased. Thus, in the case of an SRAM that precharges the input unit of the sense amplifier by using a plurality of precharge units may have a shorter preparatory period (and faster operation) than the case of a similar SRAM that precharges the input unit of the sense amplifier by using only one precharge unit, as a result, a speed of the SRAM may be increased.

The memory cells in the exemplary embodiment depicted in FIG. 6 are SRAM, but the present invention is not limited to SRAM. It will be easily understood by those skilled in the art that the present invention may be applied to internal circuits of other semiconductor devices having pairs of signal lines, precharge units configured to precharge the pairs of signal lines, a sense amplifier, and a multiplexer. The multiplexer selects a pair of signal lines among the pairs of signal lines to connect the selected pair of signal lines to the sense amplifier within a read/write (data transmission) period and selects at least two pairs of signal lines among the pairs of signal lines to connect the selected pairs of signal lines to the sense amplifier within a preparatory period.

As described above, a memory device according to the present invention may operate at a higher speed and may be integrated in a smaller area.

Also, the disclosed method for precharging using precharge units and a multiplexer may be applied to various semiconductor devices that require a high operation speed and a high degree of integration.

As a matter of conveniences exemplary embodiments of the present invention are described based on an SRAM memory device. However, the present invention is not limited the SRAM. Exemplary embodiments of the present invention may be applied to other memory devices such as a DRAM, a PRAM, a FRAM or a MRAM, may be applied to an embedded memory that Is included in a system on a chip (SOC). Also, exemplary embodiments of the present invention may be applied to an apparatus for transmitting or detecting signals using a sense amplifier that is included in a semiconductor device other than a memory device.

While the exemplary embodiments of the present invention and their features have been described in detail, it should be understood that various changes, substitutions and alterations may be made herein without departing from the scope of the invention as defined in the following claims. In the claims, the phrase "at least four" represents a natural number equal to or greater than four, the phrase "at least two" represents a natural number equal to or greater than two, and the phrase "more than two" represents a natural number greater than 2, and the symbol "N" represents a natural number, and "2N" represents 2 times N, etc.

What is claimed is:

1. An apparatus for delivering a signal, comprising:
   2N signal lines;
   N precharge units configured to precharge the 2N signal lines;
   a sense amplifier configured to sense and amplify voltage levels of the signal lines; and
   a multiplexer configured to select two of the signal tines among the N signal lines and to connect the selected two signal lines to the sense amplifier within a transmission period;
   wherein the multiplexer is adapted to select at least four of the signal lines among the 2N signal lines and to connect the selected at least four signal lines to the sense amplifier within a preparatory period, and the multiplexer includes N switching units each switching unit being connected to two of the 2N signal lines, the apparatus further comprising: a multiplexer control unit configured to receive a multiplexer control signal and to generate N switching signals for controlling the N switching units, wherein at least two of the switching signals are generated based on logically combining a column address signal and the multiplexer control signal, the multiplexer control signal being activated within the preparatory period.

2. The apparatus of claim 1, wherein the 2N signal lines comprise N pairs of signal lines, each pair of signal lines being configured to access a memory cell.

3. The apparatus of claim 2, wherein the multiplexer is adapted to select at least two pairs of signal lines among the N pairs of signal lines and to connect the selected at least two pairs of signal lines to the sense amplifier within the preparatory period.

4. The apparatus of claim 1, wherein the multiplexer selects all of the 2N signal lines and connects all of the 2N signal lines to the sense amplifier within the preparatory period.

5. A memory device, comprising:
   2N bit lines connected to memory cells;
   N precharge units configured to precharge the 2N bit lines;
   a sense amplifier configured to sense and amplify voltage levels of the bit lines; and
   a multiplexer configured to select two bit lines among the 2N bit lines and to connect the selected two bit lines to the sense amplifier within a transmission period;
   wherein the multiplexer is adapted to select at least four of bit lines among the 2N bit lines and to connect the selected at least four bit lines to the sense amplifier within a preparatory period,
   and the multiplexer includes N switching units each switching unit being connected to two of the 2N bit lines, the memory device further comprising:
   a multiplexer control unit configured to receive a multiplexer control signal and to generate N switching signals for controlling the N switching units, wherein at least two of the switching signals are generated based on logically combining a column address signal and the multiplexer control signal, the multiplexer control signal being activated withing the preparatory period.

6. The memory device of claim 5, wherein the multiplexer selects all 2N pairs of bit lines to connect all of the 2N bit lines to the sense amplifier within the preparatory period.

7. The memory device of claim 5, wherein the multiplexer selects eight bit lines among the 2N bit lines and connects the selected eight bit lines to the sense amplifier within the preparatory period.

8. The memory device of claim 5, wherein the multiplexer control unit includes a NOR-gate that performs a logical NOR operation upon the column address signal and upon the multiplexer control signal.

9. The memory device of claim 5, further comprising:
a multiplexer control signal generating unit configured to generate the multiplexer control signal based on an internal dock.

10. The memory device of claim 9, wherein the multiplexer control signal generating unit generates the multiplexer control signal by inverting the internal clock.

11. The memory device of claim 5, wherein the memory device is a static random access memory (SRAM).

12. The memory device of claim 5, wherein the memory device is a dynamic random access memory (DRAM).

13. A method for operating a memory device, the memory device including 2N bit lines connected to memory cells, N precharge units configured to precharge the 2N bit lines, a sense amplifier, and a multiplexer configured to selectively connect the sense amplifier with the 2N bit lines, the method comprising:
selecting more than two bit lines among the 2N bit lines and connecting the selected more than two bit lines to the sense amplifier within a preparatory period and precharging the more than two bit Lines while they are connected to the sense amplifier within the preparatory period;
selecting two bit lines among the 2N bit lines and connecting the selected two bit lines to the sense amplifier within a data transmission period;
generating a multiplexer control signal based on an internal clock;
generating switching signals, based on a column address and the multiplexer control signal, for selecting the more than two bit lines precharged within the preparatory period; and then
generating switching signals, based on the column address signal and the multiplexer control signal, for selecting the two bit lines selected within the transmission period.

14. The method of claim 13, further comprising precharging all of the 2N bit lines while the more than two bit lines are connected to the sense amplifier within the preparatory period.

15. The method of claim 13, wherein the 2N bit lines comprise N pairs of bit lines, each pair of bit tines being configured to access a memory cell and the more than two bit lines include at least one pair of bit lines and the selected two bit lines comprise one pair of bit lines.

16. The method of claim 13, wherein selecting two bit lines among the 2N bit lines and connecting the selected two bit lines to the sense amplifier within a data transmission period includes selecting the two bit lines among the more than two bit lines selected, connected and precharged within the preparatory period.

17. The method of claim 13, wherein selecting more than two bit lines among the 2N bit lines within the preparatory period includes selecting all of the 2N bit lines to connect all of the 2N bit lines to the sense amplifier within the preparatory period.

18. The method of claim 13, wherein selecting more than two bit lines among the 2N bit lines within the preparatory period includes selecting eight bit lines among the 2N bit lines to connect the selected eight bit lines to the sense amplifier.

* * * * *